(12) United States Patent
Wu et al.

(10) Patent No.: US 10,304,599 B2
(45) Date of Patent: May 28, 2019

(54) MODULAR POTENTIOMETER

(71) Applicant: NATIONAL CHUNG SHAN INSTITUTE OF SCIENCE AND TECHNOLOGY, Taoyuan (TW)

(72) Inventors: Ruh-Hua Wu, Taoyuan (TW); Ting-Hung Su, Tanwen Vil. (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 58 days.

(21) Appl. No.: 15/629,814

(22) Filed: Jun. 22, 2017

(65) Prior Publication Data
US 2018/0374615 A1  Dec. 27, 2018

(51) Int. Cl.
| | |
|---|---|
| *H01C 10/10* | (2006.01) |
| *G01D 5/14* | (2006.01) |
| *G01R 33/07* | (2006.01) |
| *H01L 43/06* | (2006.01) |

(52) U.S. Cl.
CPC .......... *H01C 10/103* (2013.01); *G01D 5/145* (2013.01); *G01D 5/147* (2013.01); *G01R 33/072* (2013.01); *H01L 43/06* (2013.01)

(58) Field of Classification Search
CPC ...... H01C 10/13; G01D 5/147; G01R 33/072; H01L 43/06
See application file for complete search history.

(56) References Cited

U.S. PATENT DOCUMENTS

| | | | | | |
|---|---|---|---|---|---|
| 3,286,161 | A | * | 11/1966 | Jones | ...................... H01L 43/06 257/E43.002 |
| RE33,089 | E | * | 10/1989 | Pepper | .................... F21V 23/00 340/644 |
| 5,805,146 | A | * | 9/1998 | Jaeger | ................. G02F 1/13306 345/172 |
| 7,521,921 | B2 | * | 4/2009 | Zhu | ........................ G01D 5/165 324/207.17 |
| 9,148,102 | B2 | * | 9/2015 | Wu | ......................... H03G 3/04 |
| 2004/0017187 | A1 | * | 1/2004 | Van Ostrand | .......... G01D 5/145 324/207.21 |
| 2013/0200886 | A1 | * | 8/2013 | Kirste | .................. G01D 5/2455 324/207.22 |
| 2015/0338473 | A1 | * | 11/2015 | Diaconu | ............ G01R 33/0029 324/251 |

FOREIGN PATENT DOCUMENTS

TW    201447237 A    12/2014

* cited by examiner

*Primary Examiner* — Kyung S Lee
(74) *Attorney, Agent, or Firm* — Schmeiser, Olsen & Watts, LLP

(57) ABSTRACT

A modular potentiometer includes a magnetic block slide unit including a slide and a magnetic block disposed on the slide; a magnetic field sensing unit parallel to the magnetic block slide unit and including at least one Hall device and a circuit board electrically connected to the at least one Hall device, wherein the circuit board is modularized so that portions thereof are connected in series; a signal processing unit electrically connected to the magnetic field sensing unit to receive a sensing signal from the magnetic field sensing unit and thereby calculate a distance traveled by the magnetic block. Hence, due to the aforesaid segmental design, the non-contact potentiometer is easy to manufacture, mount, demount, and carry, and its manufacturing cost is reduced by modularizaton.

9 Claims, 4 Drawing Sheets

MODULAR POTENTIOMETER

FIELD OF THE INVENTION

The present invention relates to a potentiometer-based measurement device and, more particularly, to a potentiometer which operates by Hall effect and has a variable journey.

BACKGROUND OF THE INVENTION

There is a wide variety of commercially-available displacement measurement devices, such as optical rulers, potentiometers, and laser rangefinders (precise but expensive), to choose from as needed in terms of measurement requirement, precision, and surroundings.

Operating by optical theories, an optical ruler essentially comprises a grating ruler, a mask plate, a plurality of light-emitting devices, and a plurality of sensing devices. Both the grating ruler and the mask plate consist of transparent and opaque lines spaced apart and distributed uniformly. The transparent and opaque lines of the grating ruler are spaced apart equidistantly. The lines of mask plates are distributed in a way to make the mask plates fall substantially into two categories: mask plate A and mask plate B. There is a 90° angle difference between the two mask plates. Therefore, when transparent and opaque lines of mask plate A and grating ruler are arranged neatly, transparent and opaque lines of mask plate B and grating ruler differ by 0.25 grating cycle, and vice versa. The light-emitting devices in the optical ruler are disposed on the back of the grating ruler, whereas the sensing devices are disposed on the back of mask plate A and mask plate B. With the optical ruler being in operation, both the grating ruler and a light emitter are fixed in place, using the moving mask plates and sensor to measure displacement. The conventional optical ruler is enclosed by a metallic casing. By contrast, novel optical rulers dispense with any metallic casing but are each equipped with a sliding block and a magnetic ruler body so as to operate in the same way as conventional optical rulers, thereby being advantageously lightweight. However, the novel optical rulers are disadvantaged by a complicated process of adhering the ruler body in place. As a result, the novel optical rulers have to be adhered in place by technicians.

Depending on an adopted sensing principle, potentiometers fall into three categories: non-contact magnetic induction potentiometers, non-contact magnetoresistance variable potentiometers, and contact-style electrically conductive rubber potentiometers.

The non-contact magnetic induction potentiometer comprises a Hall device and a permanent magnet. A magnetic field variation produced by the displacement between the permanent magnet and a bias winding is converted into an electrical signal by the Hall device.

The non-contact magnetoresistance variable potentiometer comprises a magnetic induction resistance device and a permanent magnet. The permanent magnet is fixed in place, and the magnetic induction resistance device undergoes a displacement to therefore produce an impedance variation, so that median voltage output is measured by voltage division, thereby calculating the displacement.

The contact-style electrically conductive rubber potentiometer is integrally formed by pressing and heating the surface of synthetic resin and a refined carbon element fine filler, wherein onto its smooth sliding surface carbon elements are printed. Its manufacturing process involves adjusting local resistance by laser cutting calibration so that it is capable of precise voltage—position performance.

However, the aforesaid displacement measurement devices have a disadvantage in common: after being purchased, the displacement measurement devices have their journey specified; to increase or decrease the journey, the owner has to buy another displacement system, not to mention that a slide with a long journey takes up too much space, and in consequence the displacement measurement devices are not portable.

SUMMARY OF THE INVENTION

In view of the aforesaid drawbacks of the prior art, it is an objective of the present invention to provide a displacement measurement device with a variable journey, essentially comprising a magnetic block slide unit, a magnetic field sensing unit, and a signal processing unit, wherein segmental slides and the magnetic field sensing unit effectuate the variable journey so that the displacement measurement device is not only easy to manufacture, mount, demount and carry but also incurs low manufacturing costs by modularization.

In order to achieve the above and other objectives, the present invention provides a modular potentiometer, comprising: a magnetic block slide unit comprising a slide and a magnetic block disposed on the slide; a magnetic field sensing unit parallel to the magnetic block slide unit and comprising at least one Hall device and a circuit board electrically connected to the at least one Hall device, wherein the circuit board is modularized so that portions thereof are connected in series to therefore effectuate flexible adjustment of a sensing distance; and a signal processing unit electrically connected to the magnetic field sensing unit to receive a sensing signal from the magnetic field sensing unit and thereby calculate a distance traveled by the magnetic block.

In an embodiment of the modular potentiometer, the slide is demountable and thus conducive to increasing or decreasing a length of the slide. The required quantity of the Hall devices depends on the slide length. The Hall device senses the position of the magnetic block on the slide by electromagnetic sensing. The Hall device is directly disposed on the circuit board or electrically connected to the circuit board to allow the circuit board to perform statistical analysis of the signals sensed by the plurality of Hall devices. The sensing signals generated from the magnetic field sensing unit are voltage levels (but the present invention is not limited thereto.) The signal processing unit contains a built-in voltage position information which provides a basis for judgment of a magnetic block position. The distance between the Hall device and the magnetic block is designed according to the Hall voltage level sensed by the Hall device by way of electromagnetic sensing, and thus the signal processing unit compares the voltage level with the voltage position information to therefore determine the magnetic block position.

In an embodiment of the modular potentiometer, each portion of the circuit board has an independently accessible signal line and is connected to VDD and GND from front and rear, respectively, in a one-male-one-female-single-need manner, wherein the VDD and the GND are connected to a Pin and a Pin sleeve, respectively.

The summary above, the detailed description below, and the accompanying drawings further explain the measures and means used to achieve predetermined objectives of the present invention and the advantages of the present inven-

DETAILED DESCRIPTION OF THE EMBODIMENT OF THE INVENTION

The features and advantages of the present invention are detailed hereinafter with reference to the preferred embodiments.

The present invention provides a magnetic field sensing unit with a variable journey to adjust a potentiometer length by the Hall effect of a Hall device (also known as Linear Hall-effect Sensor IC, LHE). The present invention employs a non-contact sensing technique based on a magnetic block and a plurality of Hall devices, mainly because the magnetic block provides a signal which enables a linear Hall device output to correlate with a position, whereas the plurality of Hall devices increase or decrease the distance of sensing, wherein output signals of linear Hall devices ensure that a signal processing unit can identify the correct position of the magnetic block.

Figure 1:
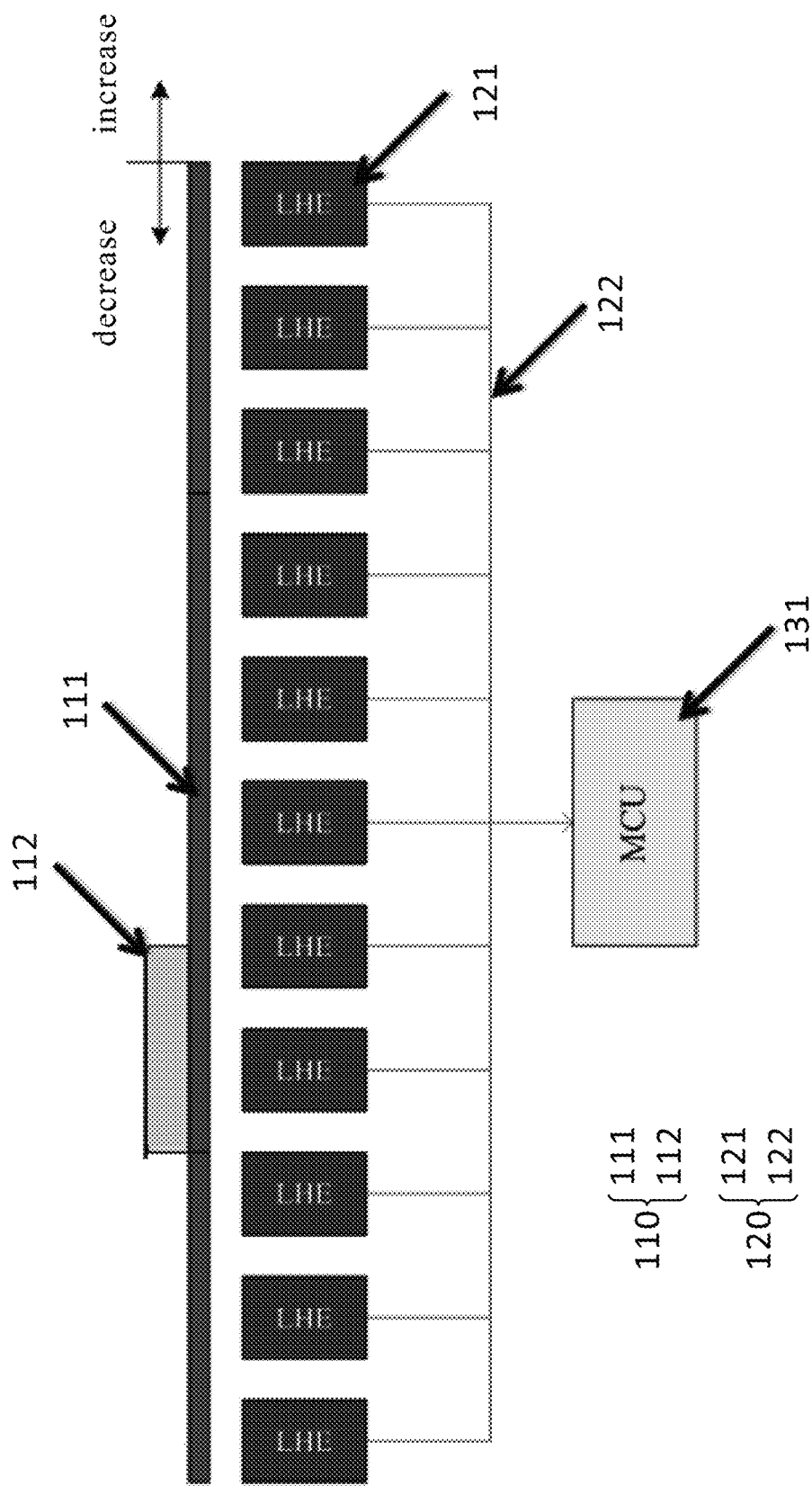
FIG. 1 is a schematic view of a modular potentiometer of the present invention.

Referring to FIG. 1, an LHE 121 is mounted on a circuit board 122, and a magnetic block 112 is mounted on a slide 111. The magnetic block 112 has a small volume but does not have a special shape, and its magnetizing strength need not be precisely controlled. The slide 111 is located at a point appropriately spaced apart from a sensor. Magnetic field information detected by the LHE 121 is sent to a signal processing unit 131. The signal processing unit 131 is a micro control unit (MCU). The MCU calculates, by table lookup (comparing built-in voltage position information), the magnetic block position and two output voltages corresponding to the magnetic block position according to the information sent from the LHE 121. The above-mentioned embodies a position sensing concept proposed by the present invention, increasing or decreasing the slide length or LHE quantity as needed.

Embodiment

Figure 2:
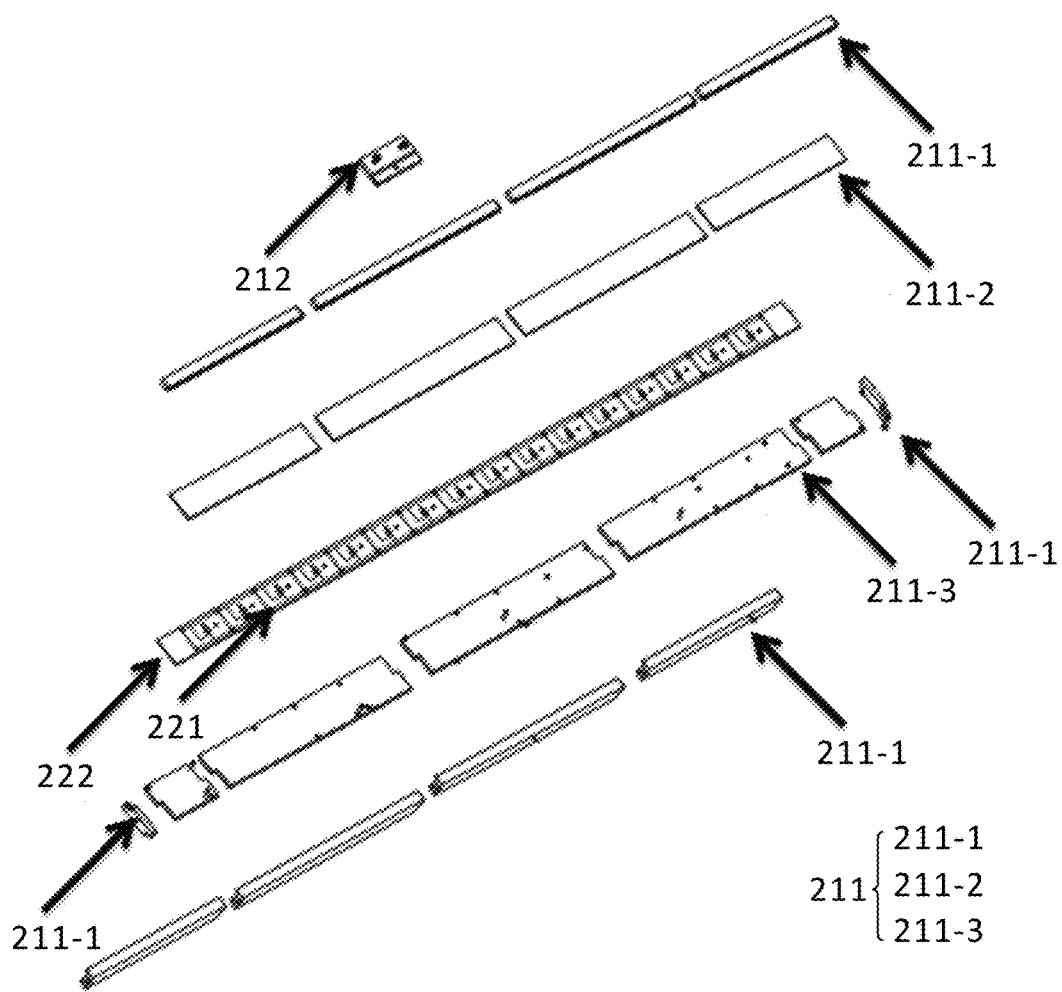
FIG. 2 is an exploded view of the modular potentiometer of the present invention.

Referring to FIG. 2, there is shown an exploded view of the modular potentiometer of the present invention. As shown in the diagram, the modular potentiometer essentially comprises a base board 211-3 for serving as a foundation, the Hall devices 221 for sensing output, circuit boards 222 for processing circuits, a sliding block 212 equipped with a magnetic block and coupled to a subject under test, a cover 211-2 which provides a sliding plane for the sliding block, and a lateral board 211-1 for limiting the position of each block. The steps taken to design the slide are as follows: 1. determine the magnetic block length, measure the preferred distance between the magnetic block and the Hall devices, wherein the range of the LHE voltage output depends on the device's power supply criteria and characteristics. In this embodiment, the magnetic block has a total length of 46 mm, wherein the distance between the magnetic block and the Hall devices is around 3-4 mm; 2. determine the distance between the Hall devices, wherein the distance must be less than the length of the magnetic block to avoid failure of MCU signal judgment, and the distance equals the length of the circuit board. In this embodiment, the distance between the Hall devices is around 0.9 time that of the length of the magnetic block, that is, 46*0.9=41.4 mm, and is rounded to 41 mm; 3. determine to increase/decrease the fundamental unit of the length, wherein the fundamental unit of the length must be multiples of the length of the circuit board, for example, five times the length of the circuit board in this embodiment, i.e., 205 mm, being the distance to be increased/decreased in a single instance, wherein, if the distance to be increased/decreased does not equal the aforesaid fundamental distance, it will be feasible to produce a shorter module at the end to match the whole length; 4. prevent the connection from overlapping during the design stage to avoid aggravation of tolerance in assembly which might otherwise lead to the tilting of the whole structure, as a result, it is not advisable to cut the blocks to the same length, and thus it is advisable to cut the base board into five pieces, each cover into four pieces, and each lateral board into eight pieces, wherein the two lateral boards differ from the middle block in length; and 5. perform circuit board design, because in a complete mechanism the circuit boards are produced by putting together their elements, and connecting the elements of the circuit boards together directly by a bonding wire adds to the difficulty in the assembly process. This embodiment can employ ping connection instead of wire bonding, provided that the Hall device signal lines are accessible. The base board bears the weight of the potentiometer and underpins the circuit boards. The lateral boards each have a plurality of grooves whereby the circuit boards and the covers are put in place. The sliding block only has one degree of freedom while sliding. Since the sliding block slides across the covers, the junction of them can be glued to meet the need for being watertight.

Figure 3:
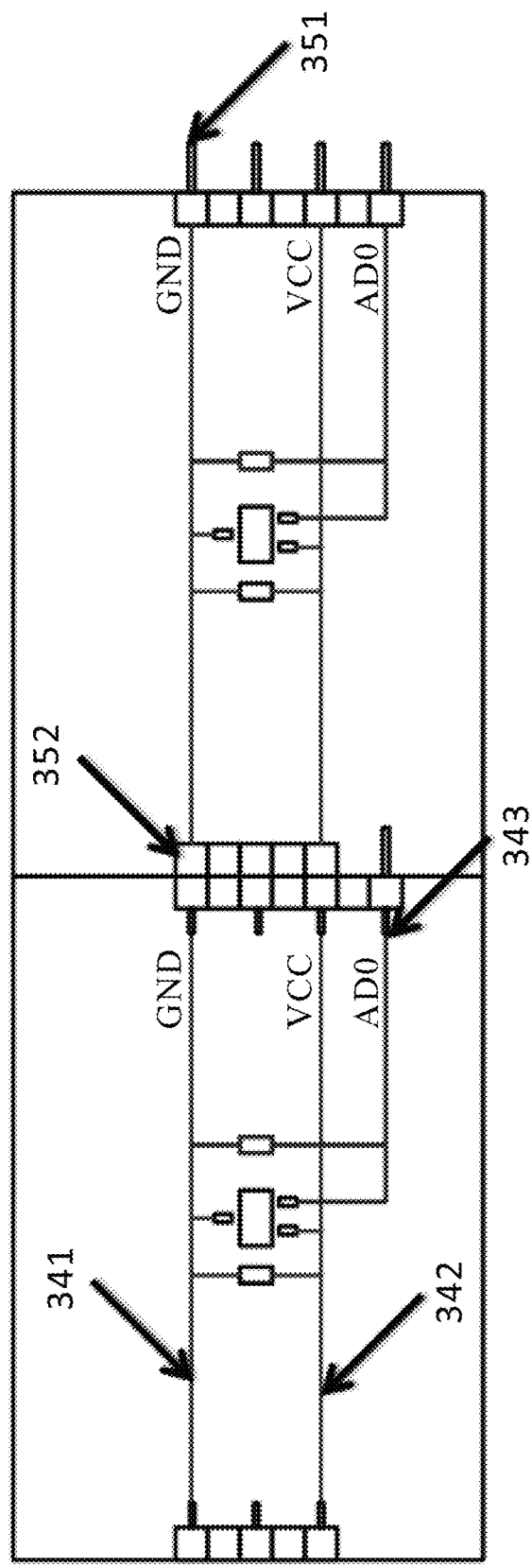
FIG. 3 is a schematic view of connections of circuit boards of the modular potentiometer of the present invention.

Referring to FIG. 3, there is shown a schematic view of connections of circuit boards of the modular potentiometer of the present invention. A slide with a variable journey requires that the circuit boards must be separable and thus cannot be connected by SMD. If the circuit boards are connected by wire bonding, not only will disassembly be inconvenient, but the circuits will also be congested. To preclude the aforesaid drawbacks, the circuit boards have the signal line 343 independently accessible, wherein a positive terminal (VDD) 342 and a ground (GND) 341 are connected to each portion of the circuit board from front and rear, respectively, in a one-male-one-female-single-need manner. The VDD and GND are connected to a Pin 351 and a Pin sleeve 352, respectively. The signal lines are independently accessible and connected in pairs. The circuit boards each have two Pins and Pin sleeves so that they can be conveniently mounted and connected. Hence, portions of the circuit boards are connected in series in a modularized manner to not only dispense with the need for wire bonding, but also render the mounting and demounting processes convenient. Due to the slide, insertion is foolproof. The lower output is a signal output. Finally, the signal lines connected to connectors for the sake of external connection.

The output signal of the device is usually a DC voltage of 0-5 V. The DC voltage is effectuated by a digital-to-analog chip (DAC) or effectuated by low-pass filtering a pulse width modulation (PWM) signal as needed in terms of use and costs. In addition to the DC voltage, the aforesaid output is in the form of a PWM signal sent through an MCU digital interface, a parallel digital output interface, or a serial UART (RS232/422/485), CAN, SPI, LIN, and I2C to augment additional values of products and applications.

According to the present invention, the magnetic block need not assume any special shape; hence, the magnetic block can be a cuboid or a sphere, though the cuboid is preferred for the sake of space saving. On the other hand, a longitudinal cuboid magnetic block is left with half of the signal range (N-pole corresponds to 2.5~4.5V only, whereas S-pole corresponds to 0.5V~2.5V only), and thus a transverse cuboid magnetizing magnetic block is the best choice as its signal range is 0.5~4.5 V. Considerations must be given to the distance between the magnetic block and the LHE when choosing a magnetic block, so as to ensure that the LHE has an output which does not fall outside the input range of the MCU ADC (analog-to-digital converter). Considerations must be given to a sufficiently large length of the magnetic block when choosing a magnetic block, so as to ensure that the MCU can search a data table (which contains a built-in voltage position information) for the corresponding position successfully. If the magnetic block is overly short, the MCU will fail to infer the position of the magnetic block from the data table (which contains a built-in voltage position information) in accordance with the data of the LHE.

The fields in the data table increase with the LHE. If the MCU scans the output of all the LHEs, AD conversion performed by the MCU will actually take much more time than is calculated. The present invention proposes a partial scan technique which involves scanning all AD channels only when a boost occurs to find the initial position and then scanning two LHEs in the vicinity of the position according to the current position of the magnetic block. It is because the magnetic field data variation sensed by the two LHEs in the vicinity of the magnetic block is significant, whereas distant LHEs cannot sense the magnetic field variation of the magnetic block. Hence, it is not necessary to scan signals of those LHEs which are far from the magnetic block. Cost reduction can be achieved by increasing excess LHEs or ADC chips, without causing significant changes in product production and test process and upgrading the MCU in accordance with tuner length. Furthermore, mass production merely requires that products with different lengths are held by a correction clamp.

Figure 4:
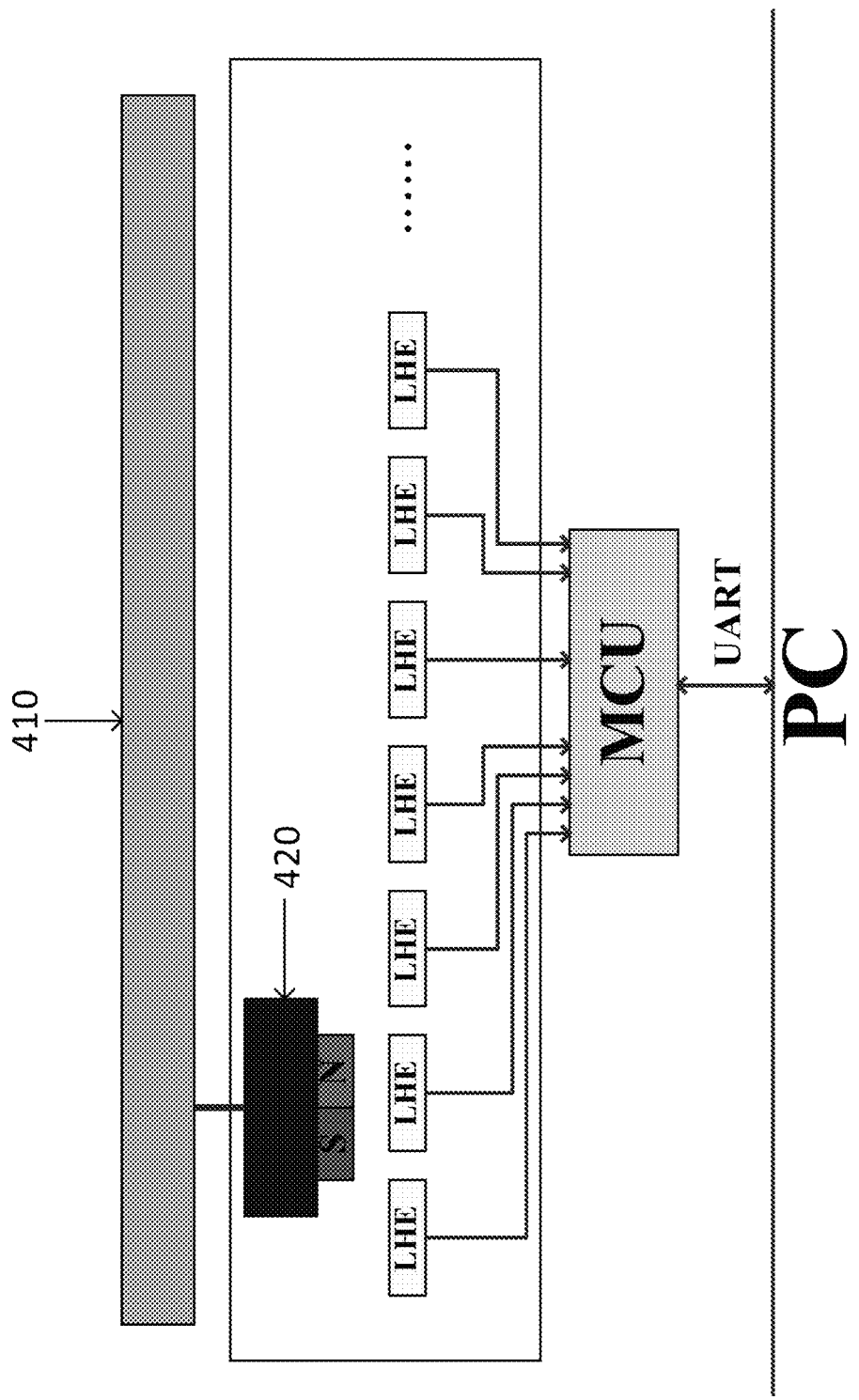
FIG. 4 is a schematic view of another modular potentiometer of the present invention.

Referring to FIG. 4, to effectuate correction according to an embodiment of the present invention, a magnetic block is magnetically attached to a slide table 420, and the slide table 420 is connected to a linear slide 410. The linear slide 410 not only enables the mechanism to keep moving linearly but also records the displacement (easily achieved by an external optical ruler) of the slide table 420 so that the displacement-related data thus recorded will be for use by the Hall device correction signal, and the linear slide 410 is removed as soon as signal-based correction is done. As shown in FIG. 4, signals of the LHEs vary with the sliding of the magnetic block and are sent to the MCU through the ADC interface, and the MCU captures the optical ruler signal of the correction slide to therefore send all the data to a personal computer through the UART or any other interface. The personal computer is provided with an appropriate interface for processing correction data sent from the MCU. After a data table is compiled from the correction data, it is burnt into the MCU to effectuate independent operation.

The above embodiments are illustrative of the features and effects of the present invention rather than restrictive of the scope of the substantial technical disclosure of the present invention. Persons skilled in the art may modify and alter the above embodiments without departing from the spirit and scope of the present invention. Therefore, the scope of the protection of rights of the present invention should be defined by the appended claims.

What is claimed is:

1. A modular potentiometer, comprising:
   a magnetic block slide unit comprising a slide and a magnetic block disposed on the slide;
   a magnetic field sensing unit parallel to the magnetic block slide unit and comprising at least one Hall device and a circuit board electrically connected to the at least one Hall device, wherein the circuit board is modularized so that portions thereof are connected in series; and
   a signal processing unit electrically connected to the magnetic field sensing unit to receive a sensing signal from the magnetic field sensing unit and thereby calculate a distance traveled by the magnetic block;
   wherein the slide comprises covers that are demountable for increasing or decreasing a length of the slide.

2. The modular potentiometer of claim 1, wherein the magnetic field sensing unit is modularized so that portions thereof are connected in series.

3. The modular potentiometer of claim 1, wherein the Hall device senses a position of the magnetic block electromagnetically.

4. The modular potentiometer of claim 1, wherein the Hall device is disposed on the circuit board.

5. The modular potentiometer of claim 1, wherein the sensing signal is a voltage level.

6. The modular potentiometer of claim 5, wherein the signal processing unit contains a built-in voltage position information.

7. The modular potentiometer of claim 6, wherein the signal processing unit compares the voltage level with the voltage position information and thereby determines the magnetic block position.

8. The modular potentiometer of claim 1, wherein a distance between the Hall device and the magnetic block depends on a Hall voltage level sensed electromagnetically by the Hall device.

9. The modular potentiometer of claim 1, wherein each portion of the circuit board has an independently accessible signal line and is connected to VDD and GND from front and rear, respectively, in a one-male-one-female-single-need manner, wherein the VDD and the GND are connected to a Pin and a Pin sleeve, respectively.

* * * * *